United States Patent [19]

Broussoux et al.

[11] Patent Number: 4,500,377
[45] Date of Patent: Feb. 19, 1985

[54] PROCESS FOR THE PRODUCTION OF A BLOCK OF PIEZOELECTRIC MACROMOLECULAR MATERIAL

[75] Inventors: Dominique Broussoux; Hugues Facoetti; Pierre Ravinet; Daniel Bernard; Francois Micheron, all of Paris, France

[73] Assignee: Thomson-CSF, Paris, France

[21] Appl. No.: 424,292

[22] Filed: Sep. 27, 1982

[30] Foreign Application Priority Data

Dec. 31, 1981 [FR] France ............. 81 24560

[51] Int. Cl.³ ............................................. B32B 31/08
[52] U.S. Cl. .............................. 156/164; 84/DIG. 24; 156/189; 156/193; 156/250; 156/273.3; 156/274.6; 156/380.9; 264/22; 361/225
[58] Field of Search ...... 156/164, 189, 272.2, 156/272.6, 273.3, 274.6, 307.3, 380.3, 380.9, 193, 250; 428/463; 357/65; 361/225; 84/DIG. 24; 264/22

[56] References Cited

U.S. PATENT DOCUMENTS

| 2,774,747 | 12/1956 | Wolfson et al. | 357/65 |
| 2,865,790 | 12/1958 | Baur | 156/274.6 |
| 2,944,117 | 7/1960 | Gray | 84/DIG. 24 |
| 3,030,290 | 4/1962 | Ryan | 156/272.6 |
| 3,031,357 | 4/1962 | Balkin et al. | 156/193 |
| 3,146,146 | 8/1964 | Anderson | 156/272.2 |
| 3,378,704 | 4/1968 | Miller et al. | 156/89 |
| 3,712,951 | 1/1973 | Rickard | 84/DIG. 24 |
| 4,278,000 | 7/1981 | Saito et al. | 84/DIG. 24 |
| 4,346,505 | 8/1982 | Lemonon et al. | 264/22 |

FOREIGN PATENT DOCUMENTS 1090291  11/1980  Canada ............... 156/272.6

Primary Examiner—Jay H. Woo
Assistant Examiner—Timothy W. Heitbrink
Attorney, Agent, or Firm—Cushman, Darby & Cushman

[57] ABSTRACT

The invention relates to the production of blocks of macromolecular material displaying piezoelectric and pyroelectric properties and provides a production process consisting in drawing a thin strip of a film of macromolecular material from a feed reel, electrically polarizing the said film and coating it with adhesive by means of a solution based on a polymeric binder before the forming on a mandrel of a roll of which the turns form, after drying, a monolithic structure which may be split into blocks.

The invention finds particular use in the production of electromechanical transducers for applications connected with electroacoustics and underwater acoustics.

21 Claims, 16 Drawing Figures

PROCESS FOR THE PRODUCTION OF A BLOCK OF PIEZOELECTRIC MACROMOLECULAR MATERIAL

The present invention relates to the production of piezoelectric polymers and copolymers which are in the form of blocks of great thickness.

BACKGROUND OF THE INVENTION

Piezoelectric polymers are utilised in particular to produce electromechanical transducers, such as transducers transmitting and receiving sonic and ultrasonic radiations.

In many applications, these macromolecular materials having a polar orientation are advantageously substituted for piezoelectric ceramics since they have the advantage of a lower Young's modulus, a lesser volumetric mass and a characteristic impedance closer to that of aqueous and biological environments. The piezoelectric coefficients are distinctly lower than those of the known piezoelectric ceramic materials, but overall performance factors of interest are reached by application of an energetic electric polarisation combined, if appropriate, with an initial mechanical treatment. An important feature of the application of piezoelectric polymers is their ease of application if there is a need for transducer elements of large area. It should equally be pointed out that the forming to shape of such elements is easy, but the most current thicknesses produced remain between a few microns and one to two millimeters.

The electric polarising field to be produced within a polymer so as to cause a conversion within the same, giving rise to the piezoelectric, electro-optical or pyroelectric properties sought, is between $5 \times 10^7$ and $1.5 \times 10^8$ volts per meter.

A high tension source is thus commonly required to polarise the polymer, and if it is intended to polarise a sample of a thickness of the centimeter in a single operation, the voltage which has to be applied is of the order of a million volts, which is prohibitive. The trend of the applications of piezoelectric polymers towards massive structures in the form of plates or blocks makes it possible to have available a greater number of parameters for appropriate location of a range of operating frequencies or for increasing the sensitivity of a pickup device for vibrational radiation. Moreover, as soon as the optimum dimensioning of a transducer necessitates choosing a thickness of the order of a millimeter, a production problem intervenes for which the solution cannot consist in simply stacking films of lesser thickness. As a matter of fact, a volume of solid material produced by stacking sheets is not mechanically equivalent to the same volume produced in one piece. It is well known that a stack of thin laminae does not withstand bending under load as would a massive plate having the thickness of the stack. Similarly, it is equally known that within a stack, each sheet may be considered as a source radiating through the adjacent sheets and that any impedance breakdown between sheets may cause undesirable reflections and losses by dissipation of power.

In order to eliminate the disadvantages listed in the foregoing, the invention proposes that a production technique be adopted which has been utilised to produce plastic film capacitors in the "slab" or "flattened coil" configurations.

SUMMARY OF THE INVENTION

The invention provides a process for the production of blocks of piezoelectric macromolecular material from a thin film utilised as an element of a multilayer structure, characterised in that it consists in cutting the said film into strips of uniform width, in drawing this strip off a reel and winding the same onto a receiving mandrel or former in such a manner as to produce a multiturn winding having the said width; the part of the said strip running between the said reel and the said mandrel being coated with adhesive on at least one of its surfaces by means of a solution of the said material in a solvent; the winding being compressed at right angles to its turns until a monolithic multilayer structure is obtained; the said blocks being formed by portions separated from the said winding and the said strip having been electrically polarised in depth before being coated with adhesive.

The invention equally provides a block obtained by the aforesaid process, in particular that in which each of the strata of piezoelectric macromolecular material is enflanked by two metallisations of lesser width than the said width and which extend flush alternately along two opposed surfaces of the said block on which are deposited metallisations assuring their interconnection into two imbricated groups.

BRIEF DESCRIPTION OF THE DRAWINGS

The invention will be more fully understood from the following description taken in conjunction with the accompanying drawings, in which.

DESCRIPTION OF THE PREFERRED EMBODIMENTS

The present invention relates to the production of piezoelectric blocks from macromolecular materials which acquire permanent piezoelectric properties when a powerful electric field is applied to them. This field is intended to align the electric dipolar moments to obtain a structure of which the macroscopic properties resemble those of the crystalline bodies appertaining to a category which is not centrosymmetric.

Amongst these macromolecular materials, polymers are known such as vinylidene polyfluoride ($PVF_2$) and its coplymers with polytetrafluoro ethylene (PTFE), or ethylene polychlorotrifluoride (PCITrFE).

These materials equally comprise alloys of vinylidene polyfluoride, for example with polymethylmethacrylate (PMMA) as well as vinyl polychloride (PVC), vinyl polyfluoride (PVF), polyamides, etc.

In the absence of any electric polarising treatment, a sheet of this material does not display any piezoelectric properties. Since these materials are excellent electrical insulators, a sheet may be polarised in depth by metallising two opposed surfaces and connecting them to a source of high direct voltage.

Figure 1:
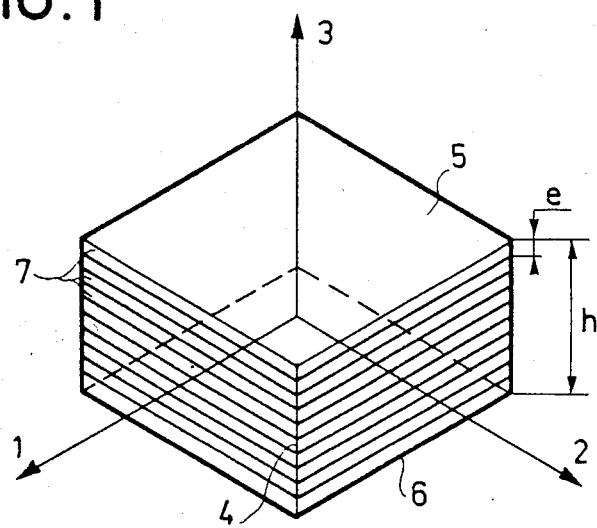
FIG. 1 is an isometric view of a piezoelectric block in accordance with the invention.

In FIG. 1 is shown a block 4 of piezoelectric polymer produced in accordance with the present invention. By way of non-restrictive example, a parallelepipedal form has been illustrated with respect to a system of crystallographic axes 1, 2, 3. As will emerge from the following description, this block 4 is a monolithic structure obtained by adhesive joining of sheets 7 of thickness e stacked up to a height h. The surfaces 5 and 6 at right angles to the axis 3 are commonly metallised in order to obtain an electromechanical transducer element vibrating in the depth mode when an alternating voltage is applied between its metallisations. By contrast, if the block of FIG. 1 is exposed to an alternating compression acting at right angles to the surfaces 5 and 6, the appearance is observed of electrical charges of opposite polarisation which may give rise to a conduction current in an external electrical circuit, or in case of an open circuit operation, an alternating potential difference between the surfaces 5 and 6. These direct and inverse piezoelectric effects result from a permanent orientation of the dipolar couples present within the aforesaid macromolecular materials. An orientation of this nature is obtained by means of a very powerful electric field requiring the application of a polarising voltage of high value. Since the materials in question have an intimate structure very difficult to specify, the study of piezoelectric properties largely resorts to experimentation. By comparing the mechanical stresses applied and the electrical charges induced, it is possible to establish correlations between the macromolecular materials endowed with piezoelectric properties and known crystalline substances. It is thus common to measure the piezoelectric coefficients $d_{31}$, $d_{32}$, $d_{33}$, $d_{24}$ and $d_{15}$ of the macromolecular materials on one would for crystals appertaining to the crystallographic categories which are not centrosymmetric.

The assumption of piezoelectric properties by a macromolecular material is facilitated to a greater or lesser degree by selection of a composition having a polar structure, by a mechanical drawing action serving the purpose of converting a non-polar phase into a polar phase, or by an electrical polarising treatment performed at a higher temperature than ambient temperature. Nevertheless, compared to the piezoelectric crystals and ceramics, the piezoelectric coefficients obtained are commonly much lower even if the electric polarisation had been applied with the maximum intensity compatible with the risk of disruption or flashover.

Fortuitously, the piezoelectric macromolecular materials have mechanical characteristics rendering them suitable for many applications, since they have a much lower Young's modulus, a low specific weight and an acoustic impedance closer to that of aqueous and biological media.

A typical example of application is that of an electromechanical transducer intended to convert an incident ultrasonic radiation into an electric voltage. The sensitivity of a transducer of this kind may be expressed by the following relationship:

$$s = (d/\epsilon) \times h \times G$$

in which s is expressed in volts per Pascal, d is the piezoelectric coefficient in question, $\epsilon$ the apparent dielectric constant, h the overall thickness of the transducer block, and G a factor which depends on the geometry of the transducer and on the ultrasonic frequency. This type of relationship is encountered, for example, in the case of hydrophones making use of a plane piezoelectric plate unconfined at its edges, in which the factor G is close to unity, but also in the case of microphones having a piezoelectric plate inset at its periphery, in which the thickness h determines the resonance frequency of the first mode of oscillation under flexure.

The merit factor M of a hydrophone is the measure of the electrical energy converted when it is exposed to a pressure of one Pascal.

Consequently:

$$M = \tfrac{1}{2} C V^2$$

in which C is the electric capacity of the cell, and V the electric voltage for one Pascal.

If G is equated to 1, it is apparent that the merit factor may be put in the form:

$$M = \tfrac{1}{2} \times (d^2/\epsilon) \times h \times S.$$

in which S is the surface of the block exposed to the pressure.

The surface S is fixed as a function of the angular directionality of the transducer, so that it is the parameter h which should be increased to raise the merit factor. The condition imposed by the operation in the depth mode with two free surfaces is that the thickness h should be equal to $\lambda/2$, and this thickness may be reduced by half with one surface blocked. For a transducer of vinylidene polyfluoride in which sound is propagated at a speed of 2000 m/s, it is apparent that an operating frequency of 1 MHz imposes a thickness h of 0.5 to 1 mm.

The problem of intensive electrical polarisation of a polymer plate having the thickness specified or a greater thickness is difficult on two counts. The electrical polarising field to be generated within the plate is of the order of 1 MV/cm and an HT or even EHT source has to be applied, which raises specific problems regarding safety and protection against disruption by breakdown or flashover. The polarisation should also be homogenous which is difficult to accomplish in a thick medium because of field gradients which may intervene because of the injection of charges via the electrodes or of separation of charges within the dielectric.

Considering another aspect, increasing the thickness of a plate of piezoelectric polymer tends to increase the electric impedance measured between the metallisations covering its surfaces. When an electromechanical transducer is utilised as a motor, the electric energising generator should supply a relatively high voltage, which frequency requires a voltage multiplying transformer between the transducer and its electric power supply circuit. This case arises in particular in electroacoustic applications where the line voltage is comparatively low. Consequently, it is desirable to have available thick transducer blocks in which an intense electrical field may be generated with a low energising voltage, which represents a second aspect of the invention.

To obtain a monolithic structure of the kind illustrated in FIG. 1, the invention took its inspiration from a capacitor production technique, which consists in producing a thick roll from a thin film. The severing or squashing of this roll results in components of the "flat coil" or "slab" types.

Figure 2:
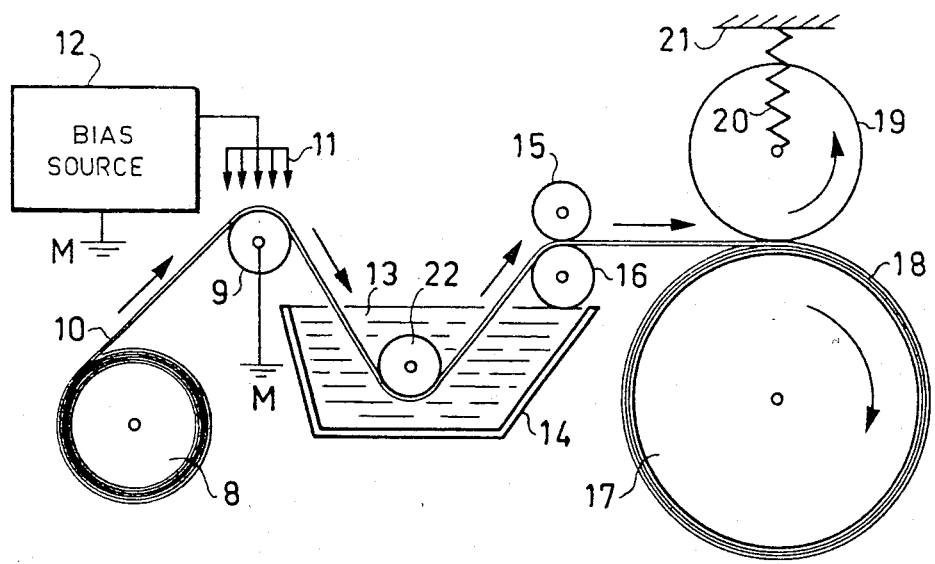
FIGS. 2 to 4 illustrate the process of production of the block of FIG. 1, FIGS. 5 and 6 illustrate electromechanical transducers produced from the block of FIG. 1, FIGS. 7 and 8 illustrate a modified embodiment enabling the production of a piezoelectric structure suitable for the method of operation by flexure.

FIG. 2 shows an illustration of the production process of the invention making it possible to obtain wholly dielectric piezoelectric blocks.

These blocks are produced from a thin film 10 of uniform thickness contained on a feed reel 8. The film 10 is produced from a selected macromolecular material, for example vinylidene polyfluoride. Its thickness e may be comprised between 6 and 30 microns so that it may easily be polarised. The film 10 may initially be in a crystalline phase $\alpha$ able to transform towards a phase $\alpha$ p during subsequent electric polarisation. It may moreover have been predrawn mechanically in its plane in one or two directions, to have a crystalline phase $\beta$ propitious for subsequent electric polarisation. In the case of the film drawn in one direction, the product obtained has unequal coefficients $d_{31}$ and $d_{32}$. In the case of a film drawn in two directions, or not drawn, the coefficients $d_{31}$ and $d_{32}$ are equal. The surfaces of the film 10 lack metallisations but, according to a modified embodiment described later, such metallisations are provided.

The film 10 unwound from the feed reel 8 forms a dielectric strip of constant width which is rolled up on a mandrel 17 in superposed turns, in such a manner as to obtain a multiturn winding 18 having aligned sides. To obtain a monolithic structure, the portion of film extending between the reel 8 and the mandrel 17 undergoes an adhesive application operation prior to being rolled up. To this end, the device of FIG. 2 comprises a set of rollers 9, 22, 15 and 16 forcing the film to plunge into an adhesive coating vat 14 which contains a solution 13. This solution serves the purpose of coating at least one of the surfaces of the film 10 so that it may subsequently act as a bonding agent between the turns of the winding 18. The solution 13 is produced starting with a solvent for the macromolecular material forming the film 10, in which the same material has been incorporated. This renders it possible to secure precise metering of the aggressivity of the solution 13 regarding the film 10 and, after forming the roll 18 and complete evaporation of the solvent, a monolithic structure is obtained wherein the bonding agent fuses with the layers, thereby suppressing any change of mechanical impedance within the block produced. The controlled attack on the film 10 by the coating solution 13 assures perfect adhesion between the turns so that all kinds of mechanical stresses are transmitted without slip between them. By way of nonlimiting example, for a film of vinylidene polyfluoride, the solution 13 will be prepared from dimethyl formamide after incorporation in the same of such quantity of vinylidene polyfluoride such that no more than the superficial region of the faces of the film 10 is acted upon by the solvent.

Figure 4:
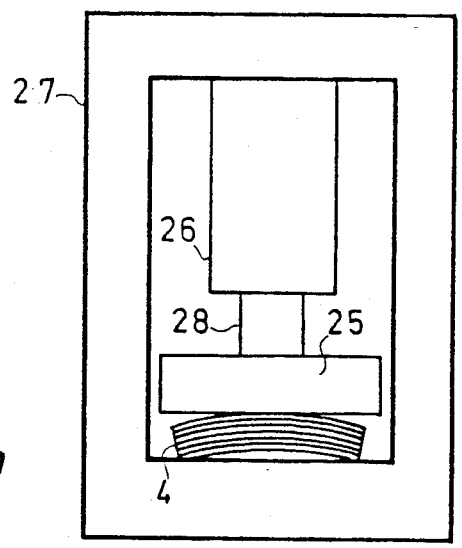

The adhesive coating operation described is followed by the actual gluing action, which may be performed on the mandrel 17 or after mounting in a press as shown in FIG. 4. If the gluing action is performed on the mandrel 17, the roll 18 is compressed by a roller 19 as shown in FIG. 2. The spindle of the roller 19 is exposed to the radial thrust of a spring 20 of which the compression is adjusted by the displacement of a stop 21. To prevent any creasing of the turns of the roll 18, the mandrel 17 and the roller 19 are driven in counterrotating displacements operated by means of driving and transmission elements not illustrated in the Figure. The mandrel 17 may easily comprise flats to obtain a roll 18 of polygonal outling. The thrust of the roller 19 may be applied during the winding stage or after the roll 18 has been completed and separated by severing the film 10. This in situ calendering may be performed by raising the speed of rotation of the mandrel 17.

In the layout illustrated in FIG. 2, an arrangement is apparent upstream of the coating vat 13, of means making it possible to provide the electric polarisation of the film 10 when this latter is not initially piezoelectric. For example, this arrangement comprises a metal roller 9 connected to the earth M of an electric voltage generator. A set of needle electrodes 11 is connected to the generator 12 and placed close to the part of the film 10 carried by the roller 9 to engender a corona discharge intended to make the film 10 piezoelectric. Since the film 10 is much thinner than the roll it will form, this arrangement is advantageous since the polarising voltage may be much lower than that which would have to be applied to polarise the roll in one piece.

By way of non-limiting example, the polarisation of the film 10 for thicknesses comprised between 6 and 30 microns would require a corona discharge voltage lying between 10 and 25 kV. Upon using an unheated roller 9, a running speed of 10 cms/minute is appropriate to obtain the dipolar orientation required. This speed may be doubled if the roller 9 is heated to 80° C. The electrode system 11 may be placed at a distance of approximately 2 cms from the film 10. The electric charges deposited on the film 10 may be neutralised when the film is plunged into the solution 13. The solution 13 may be heated to 70° C. The conductivity of the solution 13 establishes a short-circuit between the sides of the film 10 so that the surface charges are eliminated. The rollers 15 and 16 provide a homogenous deposit of the solution 13 with return to the vat 14 of any surplus of adhesive.

The electric polarising means illustrated in FIG. 2 may equally consist of a rolling stand devised to roll the film 10 under an electric field. The rolling operation may also be replaced by a simple calendering operation under an electric field, but the corona discharge technique is simpler to apply, compared to these cases. It should be noted that the polarising means have not been assembled into one and the same production unit with the coating means and those for forming the roll 18. The rolling operation may be performed at an increased speed of traversal, by performing the electric polarisation separately.

Figure 3:
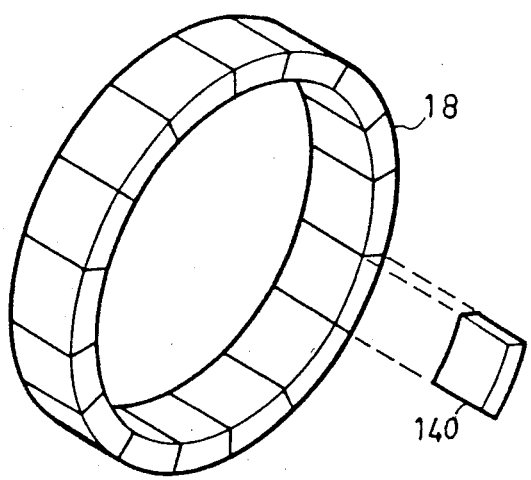

Several possibilities are available after rolling up the film 10 to obtain one or more completed piezoelectric blocks. According to one of the possible versions, the roll 18 is removed from the mandrel when the turns have been solidly jointed together. The ring 18 of FIG. 3 is thus obtained, which may be cut into pieces 140. The withdrawal and cutting of the roll 18 may equally be undertaken before total evaporation of the solvent, and the blocks 4 of which the layers may still slip with respect to each other may be placed in the press illustrated in FIG. 4. This press comprises a frame 27, a cylinder 26, a piston 28 and a plate 25 which cooperate to flatten or shape the block 4 coming from the roll 18.

Figure 7:
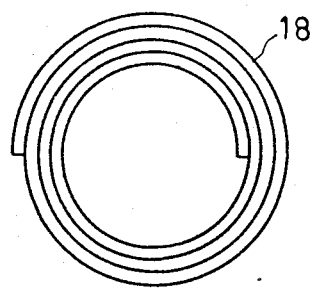
Figure 8:
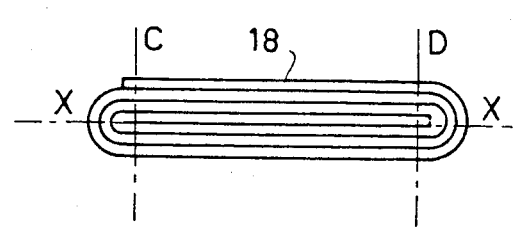

Another pressing method is shown in FIGS. 7 and 8. In this case, the roll 18 is left whole and pressed to produce the flattened winding of FIG. 8. The folded-over parts are then removed by two cuts C and D. The piezoelectric block obtained by the technique illustrated in FIGS. 3 and 4 has a homogenous polarisation throughout its thickness, provided that the polarisation of the film 10 has proceeded uniformly in step with the forming of the roll. The piezoelectric block obtained by the technique illustrated in FIGS. 7 and 8 has polarisations which are homogenous and of opposed sign at either side of the central plane marked XX. This is thus a bimorphous structure able to flex or yield under the action of an unidirectional electric energising field at right angles to the compression plane XX.

Figure 5:
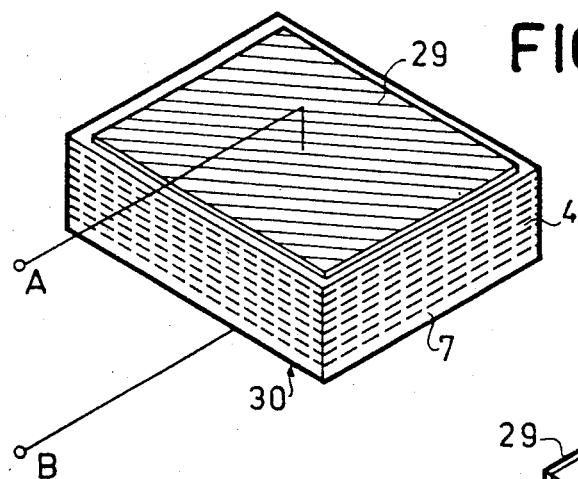
Figure 6:
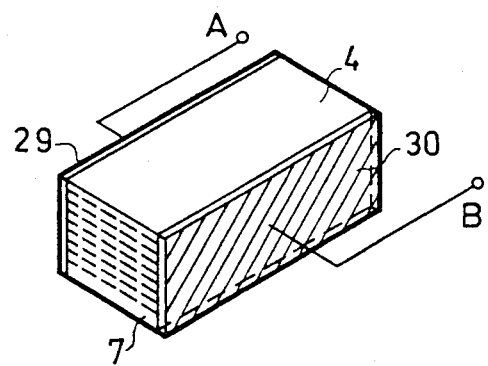

The blocks obtained by the process described are dielectric in the mass and are polarised transversely to their component layers 7. To produce an electromechanical transducer, a block of this kind is enflanked by one or more pairs of electrodes. This enflanking may occur as shown in FIG. 5 by covering the sides parallel to the layers 7 with electrodes 29 and 30 connected to two terminals A and B. The deformations are then determined by the piezoelectric coefficients $d_{31}$, $d_{32}$ and $d_{33}$. The enflanking may equally occur as shown in FIG. 6, by covering the two sides at right angles to the layers 7. In this case, the deformations are governed by the piezoelectric shearing coefficients $d_{24}$ and $d_{15}$.

Figure 14:
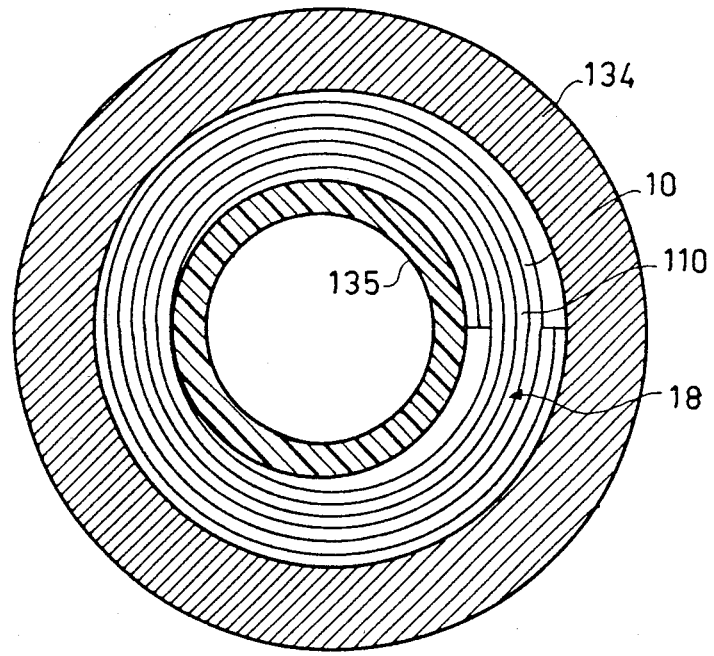
FIG. 14 is an illustration in cross-section of a compression device making it possible to exert a radial pressure on the roll illustrated in FIGS. 2 and 12, and FIGS. 15 and 16 illustrate the electric polarisations to be applied to secure an operation by the flexure method in response to an energising voltage applied to two terminals.

The invention is clearly not limited to the case of a single film 10. It is perfectly possible to provide several feed reels 8 and to form the roll 18 by winding several films 10 coming from these reels. Analogously, the cutting operation along central parting planes as shown in FIG. 3 may be completed by cuts of other directions, for example at right angles to the axis of the roll. The blocks formed in accordance with the invention may be of very different forms since the only condition imposed is that they should have two equidistant facets which may be plane, curved or domed depending on the pressing methods. The retention of the annular form of the roll is not precluded, since it is possible to produce electromechanical transducers of tubular structure. The pressing of a roll of annular form is shown in FIG. 14 in which it is apparent that the roll 18 is installed between a resilient sheath 135 and a rigid cylindrical sheath 134. By exerting an internal pressure on the sheath 135, the roll 18 may be compressed radially against the rigid sheath 134.

In many applications, it is desirable to have available electromechanical transducers of low impedance, since electronic amplifier circuits comprising semiconductors are limited as regards voltage. This kind of characteristic may be obtained by bringing the electrodes as close as possible to each other. In the piezoelectric blocks formed by a stack of layers, the shortest distance between electrodes corresponds to the thickness e of a layer which amounts to no more than the nth part of the overall thickness h of the block. For an identical piezoelectric effect, the energising voltage may consequently be divided by n by incorporating an electrode at each interface between two layers. In this case, the electrodes are formed by very light metallisations having little effect on the mechanical characteristics of the piezoelectric block; they are interconnected by lateral metallisations, as specified within the scope of production of multilayer capacitors.

Figure 9:
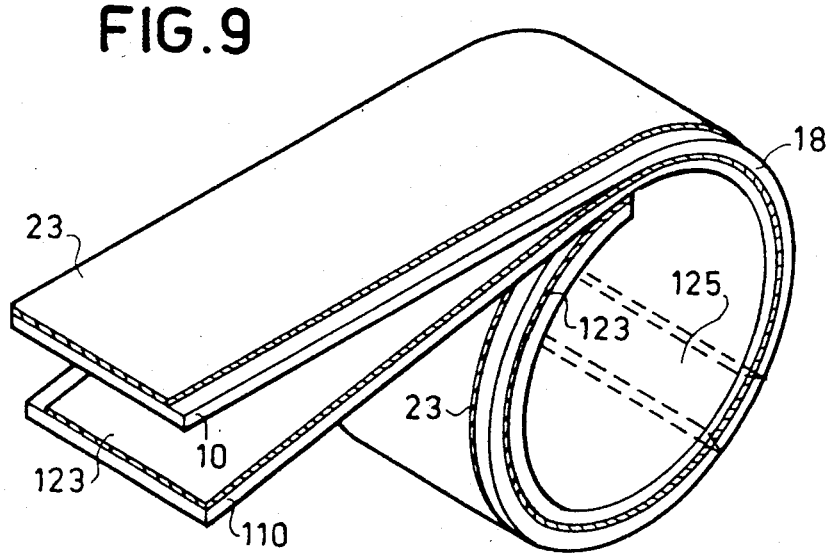
FIG. 9 illustrates a particular rolling method making use of two metallised strips.

In FIG. 9, is shown an isometric view of a roll 18 intended to produce low-impedance transducers. The roll 18 comprises two piezoelectric films 10 and 110 associated with metallisations 23 and 123 which, after rolling, separate the films 10 and 110 from each other. The metallisations 23 and 123 are carried respectively by the films 10 and 110 in FIG. 9, but it would equally be possible to have the rolling of a film devoid of metallisations with another film metallised on both surfaces. An important point is to proceed in such a manner that the metallisations 23 and 123 cover the surface of the films except for a margin situated at either side of the roll as shown in FIG. 9. The other point of importance is that the film 10 be polarised electrically in the opposed direction to that of the film 10, so that the piezoelectric effects resulting from an energising voltage applied to the metallisations 23 and 123 are commonly matched to each other.

Figure 10:
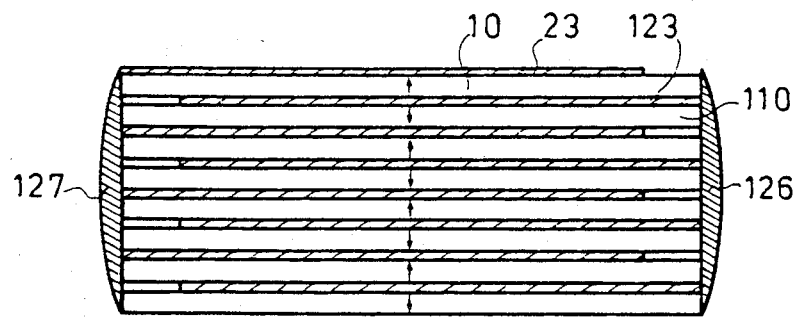
FIG. 10 is a view in cross-section of a transducer obtained from the roll of FIG. 9.

FIG. 10 illustrates a center view of the roll 18 of FIG. 9. The films 10 and 110 alternate, as do the arrows denoting the direction of electric polarisation in each layer. The metallisations 23 extend flush with the left of the roll where they are joined together electrically by a lateral metallisation 127. The metallisations 123 extend flush with the right and are joined together by a lateral metallisations 126. When the structure of FIG. 10 is energised by voltage applied to the metallisations 127 and 126, the deformations of the films 10 and 110 match each other (or are "attuned"), so that the overall vibratory mode is identical to that of the device of FIG. 5, but requires a voltage n times smaller, n being the total number of films stacked.

Figure 11:
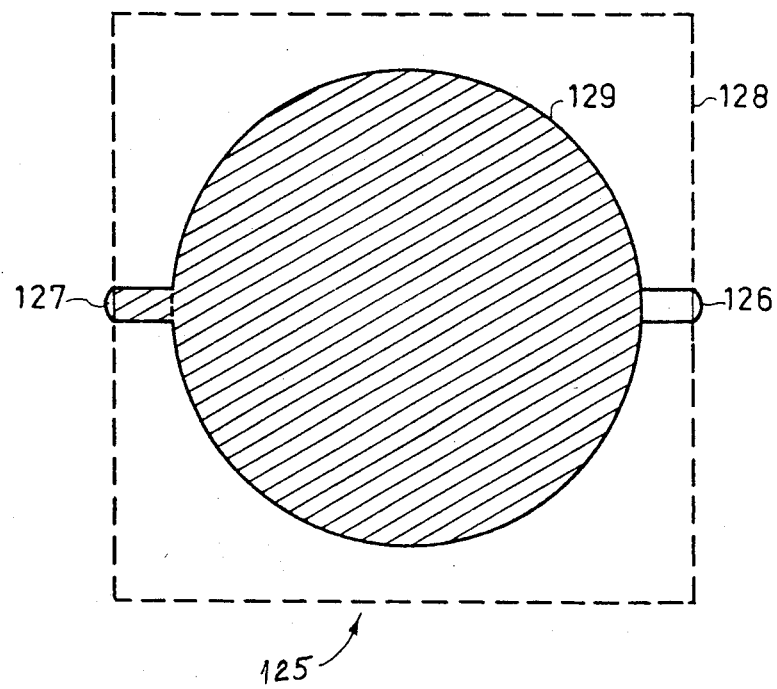
FIG. 11 is a plan view of the transducer of FIG. 10.

FIG. 11 is a plan view of a block 125 cut from the roll 18 of FIG. 9. This first cut leads to a form of rectangular outline 128, but a complementary cut may thereupon be made, for example of circular form with two lugs joining the edges of the original excision. The form 129 is energised electrically by means of metallisations 127 and 126 which cover the extremities of the two connecting lugs. The limitation of the metallisations 127 and 126 as illustrated in FIG. 11 prevents the perimeter 129 of the vibrating structure being unnecessarily stiffened.

Figure 12:
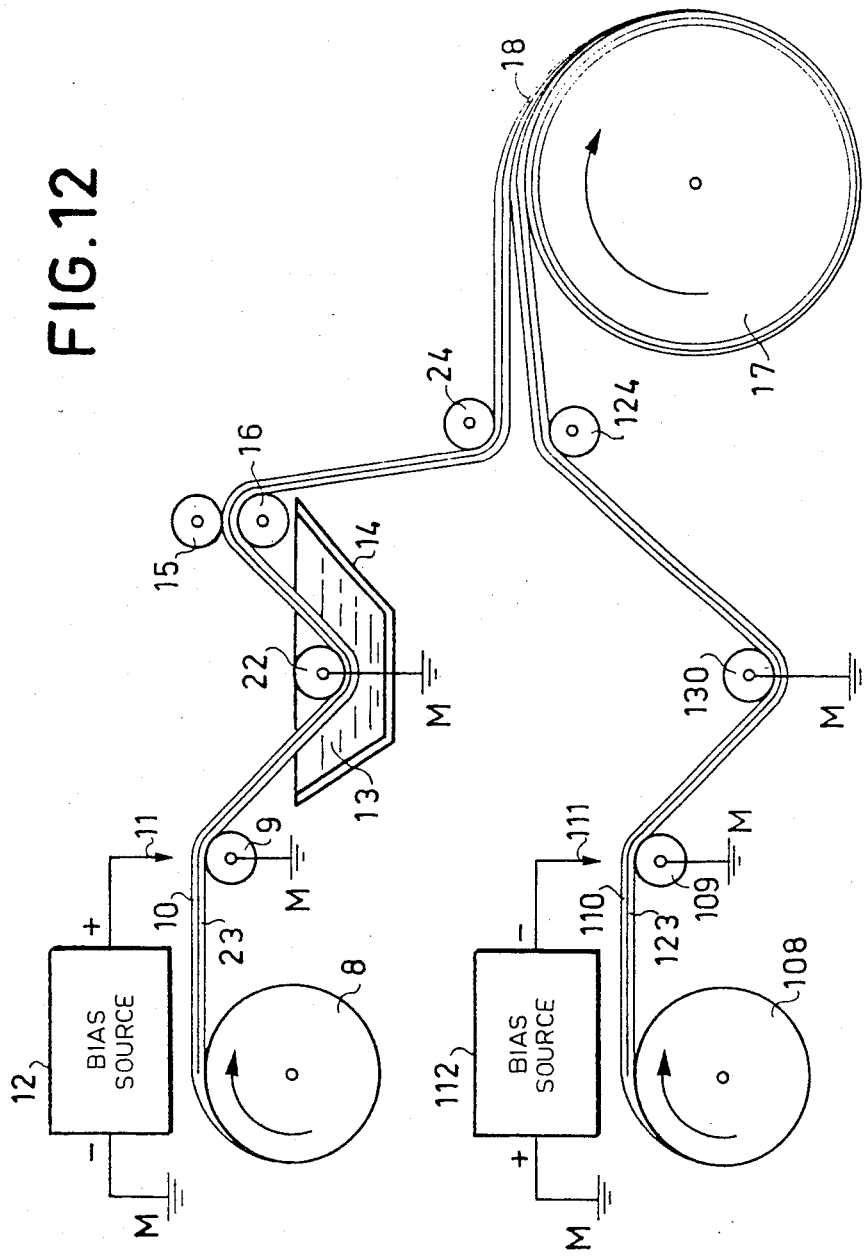
FIG. 12 illustrates the process for production of a transducer block of the kind illustrated in FIGS. 10 and 11.

FIG. 12 illustrates the process for production of a piezoelectric block comprising internal laterally connected metallisations.

Two thin films 10 and 110 of macromolecular material are unwound from feed reels 8 and 108. These films have the same thickness e and are faced with metallisations 23 and 123 arranged as shown in FIG. 9, but placed on the lower surfaces, for example. The film 10 is carried by a roller 9 connected to the earthing point M of an electric generator 12. A corona electrode 11 connected to the positive pole of the generator 12 hangs down over the bare surface of the film 10 and acts to polarise the same transversely in a first direction. The film 10 bearing the metallisation 23 is then coated with adhesively by means of a solution 13 contained in the vat 14. A roller 22 connected to earth M assures immersion of the composite film 10–23 and the neutralisation of the free charges created by the corona discharge. Rollers 15 and 16 assure uniform coating with adhesive of the composite film which, after passing over a deflector pulley, reaches the mandrel 17 on which it is rolled together with the other composite film 110–123. The composite film 110–123 is polarised electrically by a corona electrode 111 connected to the negative pole of the electric generator 112. This electrode 111 hangs down over the film 110–123 at the point at which it passes over the metal roller 109 connected to earth M.

The film 110-123 is polarised in a second direction opposed to the direction of polarisation of the film 10-23. A metal roller 130 connected to earth M serves the purpose of eliminating the electric surface charges which had been established by the electric polarisation. The film 110-123 leaves the roller 130 to be rolled up together with the film 10-23. To this end, a guiding roller 124 is situated close to the roller 24, so that the two films are offered up in satisfactory conditions of superimposition. As a matter of fact, the annular sides of the roll 18 should be prevented from displaying a ragged appearance. This disadvantage may be eliminated by trimming the edges of the films down to a predetermined width and by equipping the mandrel 17 with removable cheek plates.

Figure 13:
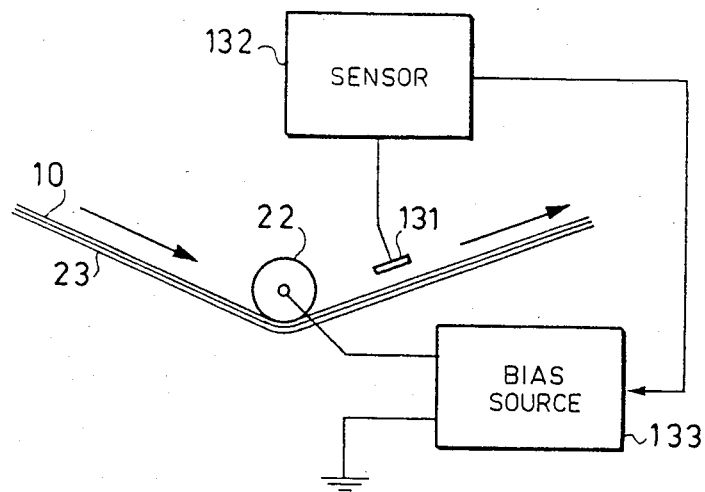
FIG. 13 illustrates a detail of the embodiment of the device of FIG. 12.

FIG. 13 shows a detail of the embodiment of the device of FIG. 2 making it possible to assure elimination of surface charges established during the polarisation. The roller 22 is connected to an electric generator 133 which between the former and earth produces an adjustable difference in potential. The electrostatic field close to the part of the film 10 leaving the roller 22 is measured by means of an electrode 131 connected to an electrometer 132. A feedback loop connects the output of the electrometer 132 to the input which controls the potential difference established by the generator 133. This loop is divised to neutralise the electric charges which could be carried by the film 10 as far as the mandrel 17. This neutralisation is more reliable than a simple earthing connection and serves the purpose of preventing the trapping of dust between the roller 22 and the rolling mandrel 17.

By way of non-limiting example, the installation illustrated in FIG. 12 makes it possible, with a linear speed of traversal of 10 cms/minute, to obtain rolled films of $PVF_2$ having piezoelectric coefficients $d_{33}=13$ $pCN^{-1}$ and $d_{31}=D_{32}\simeq 10$ $pCN^{-1}$. This applies to films initially drawn in two directions and containing 40% of $\beta$ phase. With films drawn in one direction and having the same concentration of phase $\beta$, the piezoelectric coefficients $d_{33}$ and $31$ may be higher whereas the piezoelectric coefficient $d_{32}$ amounts to between 10 and 20% of $d_{31}$.

The speed of traversal under the corona needles may be raised substantially by performing the polarising action in the hot state. Different means may be contemplated for this purpose; heating by means of hot air, by means of dielectric losses or by conduction for example by heating the rollers 9 and 109 to 80° C. The speed of traversal may be doubled and the piezoelectric coefficients are increased by 20 to 50%. As for the device of FIG. 2, the adhesive coating action will be performed with a solution 13, for example prepared from dimethyl formamide (DMF) saturated with $PVF_2$. It is also possible to dissolve in the DMF solvent a copolymer having a high concentration of $PVF_2$ ($\geq 70\%$) or an alloy with PMMA. The solution 13 will advantageously be heated to 80° C. to promote the onset of the action on the surface of the film 10 by dissolution. The rolling operation on to the driving drum 17 may equally be performed in the hot state, and the compression of the roll may also be performed under a pressure of several hundred kilogrammes per square centimeter and at a temperature of the order of 60° C.

The pressing operation performed after removal of the roll in a press such as those illustrated in FIGS. 4 and 14, offers the advantage that the rolled element need undergo a single total heating action whereas the pressing operation in situ on the mandrel 17 has the result that the first layers to be rolled are heated longer than the last ones. Given that each temperature rise tends to cause slight depolarisation of the films, there is a risk of inhomogeneity of the piezoelectric coefficients within the depth h of the block, being the origin of undesirable flexure.

When the roll is completed, it remains to establish contact with the internal metallisations. To this end, the metallisations 23 and 123 extending flush with the sides of the roll 18 are connected electrically by applying a metal on the sides by spraying in the hot state. If the metallisations borne by the films 10 and 110 are obtained by volatilisation of aluminium, the metal for facing the sides of the roll 18 may be aluminium. It should be noted that the facing of the sides of the roll with the interconnecting metal may be performed before or after cutting the roll 18. A conductive adhesive may be utilised instead of a metal as a means of interconnecting the metallisations 23 and 123. Silver plating in the cold or hot state also represents an effective means of establishing the interconnections. All that has been specified in the foregoing is applicable to films of great width. The manufacturers of films from polarisable macromolecular materials supply these films in the current width of 30, 140 and 300 cms.

Until now, it had been assumed that the electric polarisation of films is of uniform nature retained from one end to the other of the roll. The amplitude or sign of the polarising voltages may however be modifed during the rolling operation.

Figure 15:
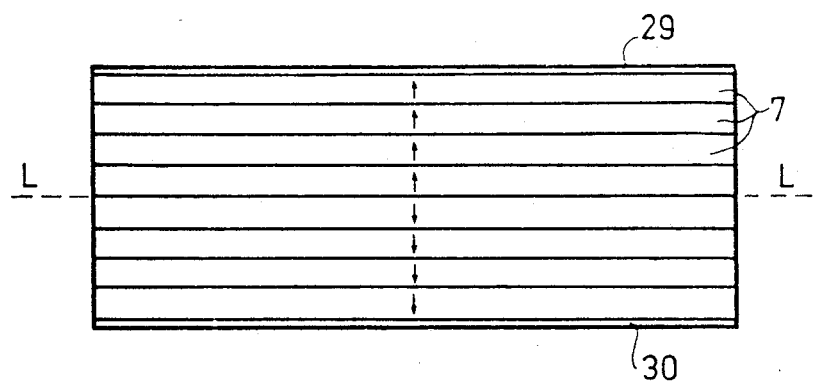

FIG. 15 is an illustration in cross-section of a piezoelectric block obtained by the process employing the arrangement of FIG. 2, except for the fact that the sign of the polarising voltage was reversed at the instant in which the roll of turns 7 reached the height marked by the line LL. As a result, as shown by the arrows of FIG. 15, the layers 7 below the line LL are all polarised from top to bottom. By contrast, the layers 7 situated above the line LL are all polarised from bottom to top.

When the block of FIG. 15 is energised by means of an alternating voltage applied to the outer electrodes 29 and 30, the part situated above the line LL is deformed in phase opposition with respect to the part situated below this line. A piezoelectric element of this kind forms a bimorphous structure of which the resulting deformation is an alternating flexure.

Figure 16:
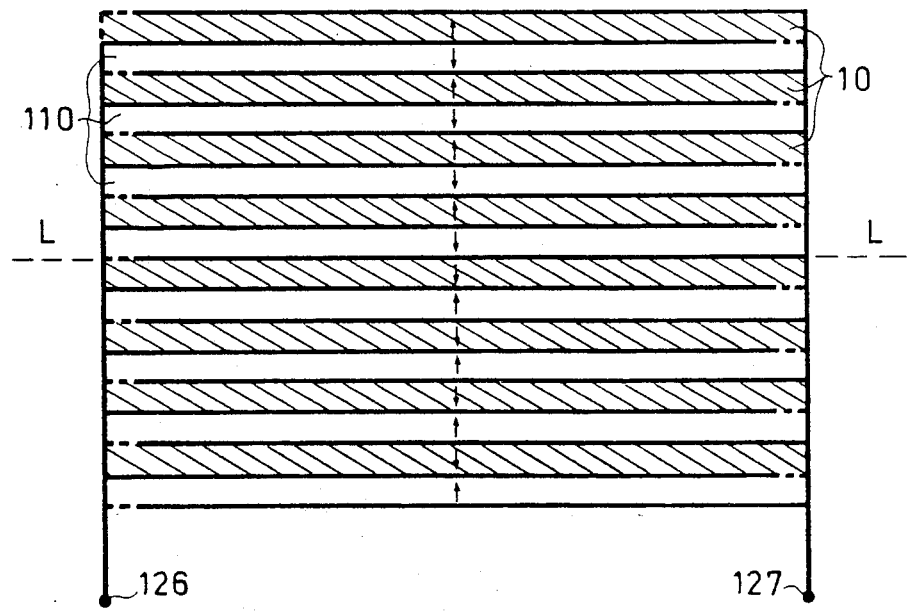

To obtain an analogous behaviour with a piezoelectric block produced by means of the device illustrated in FIG. 12, it is appropriate to perform the rolling operation partly with the polarities shown in this Figure, and to switch these polarities to complete the rolling operation. FIG. 16 illustrates a piezoelectric element produced in accordance with this technique. The arrows denote an alternation of polarisation of the films 10 and 110 which undergo a phase inversion upon passing the line LL which represents the neutral line of a bimorphous transducer. The line LL is advantageously situated at half the height of the roll to secure symmetrical alternate flexing.

It is evidently also possible to vary the amplitude of the polarisation to favour the piezoelectric effect in particular layers, for example in the outer layers which under flexure undergo greater elongations than the layers close to the neutral line LL.

The invention is not limited to laminated structures in which the inner or outer electrodes are formed by metallisations, it is equally possible to produce the electrodes lining the films before the rolling action by performing the adhesive-coating action with a solution enriched with conductive particles, for example of carbon. In this case, the need to leave margins in being at each side of the strip which is to be coated with adhesive, implies a modification of the adhesive-coating process. As it happens, the polymeric film need not be immersed in the conductive solution, but may be caused to run between two rollers which had appropriately been coated with adhesive, the width of adhesive applications being staggered to assure the transfer of the adhesive on to a part only of the width of the strip. The outer metallisations situated on the surfaces of the roll to join together the interstitial electrodes could also be replaced by deposits of polymer charged with conductive particles.

We claim:

1. Process for the production of blocks of piezoelectric macromolecular material from a thin film utilised as an element of a monolithic multilaminar structure, said process comprising the steps of:
   (a) cutting said film into a strip of uniform width;
   (b) drawing said strip off a feed reel;
   (c) conveying the strip, drawn off said feed reel according to step (b), to a receiving mandrel and rolling the strip onto said receiving mandrel thereby forming a multiturn roll having the said width;
   (d) compressing the roll formed at said mandrel according to step (c) at right angles to said turns until a monolithic multilaminar structure is obtained; and
   (e) cutting portions from the said roll to thereby form said blocks; wherein between steps (b) and (c) there are sequentially practiced the steps of:
   (i) electrically polarizing the strip across its thickness; and
   (ii) coating the strip electrically polarized according to step (i) with an adhesive on at least one surface of said strip by contacting said strip with a solution of said adhesive in a solvent.

2. Process according to claim 1 wherein two strips are drawn off two feed reels and rolled at the same time on a common receiving mandrel; at least one of the said strips being electrically polarized and coated with adhesive in such a manner as to provide a means of connection between the said strips which are superposed in the said roll.

3. Process according to claim 2, wherein the connection means are rendered electrically conductive by incorporating conductive particles in the solution for the application of the adhesive.

4. Process according to claim 3, wherein the conductive particles are carbon particles.

5. Process according to claim 2, wherein the strips are provided with metallisations enflanking each of the turns of the roll, these metallisations occupying a part of the width of the roll and extending flush with the corresponding one of its two lateral surfaces.

6. Process according to any one of claims 3 to 5, wherein conductive deposits are produced on the lateral surfaces of the said roll.

7. Process according to claim 6, wherein the said conductive deposits are formed by metallisations.

8. Process according to claim 7, wherein the said conductive deposits are formed by a polymeric material charged with conductive particles.

9. Process according to claim 1 wherein the electric polarisation in depth has the same sign throughout the height of the roll.

10. Process according to claim 1 wherein the electric polarisation in depth has the same sign in a first portion of the roll and the contrary sign in a second portion of the roll.

11. Process according to claim 2, wherein the electric polarisation in depth alternates throughout the height of the roll.

12. Process according to claim 2, wherein the electric polarisation in depth alternates in two contiguous portions of the height of the roll, the alternation changing sign upon passing from one of the said portions to the other.

13. Process according to claim 2, wherein the electric polarisation in depth is obtained by means of a corona discharge.

14. Process according to claim 2, wherein the intensity of the electric polarisation in depth is modulated during the unreeling of the said strip.

15. Process according to claim 2, wherein the compression of the roll comprises an operation for forming to shape within a press.

16. Process according to claim 15 wherein the shaping operation is performed after the precompressed roll has been drawn off the said mandrel.

17. Process according to claim 16 wherein the shaping operation is applied to the portions separated from the said roll.

18. Process according to claim 16, wherein the shaping operation is applied to the whole of the said roll.

19. Process according to claim 18, wherein the shaping operation applies a pressing means acting radially on the said roll.

20. Process according to claim 18, wherein the shaping operation imparts a flattened form to the roll.

21. A process for the production of blocks of piezoelectric macromolecular material from a thin film utilized as an element of a monolithic multilaminar structure, said process comprising the sequential steps of:
   (a) continuously drawing a strip of the thin film from a feed reel, the strip having a predetermined width;
   (b) electrically polarizing the strip across its thickness;
   (c) coating the polarized strip on at least one surface thereof with an adhesive;
   (d) rolling the strip onto a receiving mandrel to form a multi-layer body while simultaneously compressing the multi-layer body at said receiving body to adhesively affix adjacent layers thereof one-to-another; and
   (e) sectioning a portion of said multi-layer body thereby forming a block of piezoelectric macromolecular material.

* * * * *